(12) United States Patent
Kumar et al.

(10) Patent No.: US 10,310,014 B1
(45) Date of Patent: Jun. 4, 2019

(54) METHOD TO CONVERT OVM/UVM-BASED PRE-SILICON TESTS TO RUN POST-SILICON ON A TESTER

(71) Applicant: Xilinx, Inc., San Jose, CA (US)

(72) Inventors: Subodh Kumar, San Jose, CA (US); Aniruddha Talukder, Santa Clara, CA (US); Kameswari SB Angada, Hyderabad (IN)

(73) Assignee: XILINX, INC., San Jose, CA (US)

( * ) Notice: Subject to any disclaimer, the term of this patent is extended or adjusted under 35 U.S.C. 154(b) by 134 days.

(21) Appl. No.: 15/153,559

(22) Filed: May 12, 2016

(51) Int. Cl.
*G01R 31/317* (2006.01)
*G01R 31/3177* (2006.01)
*G01R 31/327* (2006.01)

(52) U.S. Cl.
CPC ... *G01R 31/31725* (2013.01); *G01R 31/3177* (2013.01)

(58) Field of Classification Search
CPC .......... G01R 31/31725; G01R 31/3181; G01R 31/3183; G01R 31/318357; G01R 31/3177
See application file for complete search history.

(56) References Cited

U.S. PATENT DOCUMENTS

| | | | | |
|---|---|---|---|---|
| 5,481,549 A * | 1/1996 | Tokuyama | ....... | G01R 31/31922 714/736 |
| 5,912,572 A * | 6/1999 | Graf, III | ................ | H03L 7/00 327/144 |
| 5,923,867 A * | 7/1999 | Hand | ............... | G01R 31/31704 703/14 |
| 7,085,706 B1 * | 8/2006 | McGettigan | ........ | G06F 17/5054 326/41 |
| 7,266,740 B1 * | 9/2007 | Wu | ................... | G01R 31/31725 714/724 |
| 7,821,295 B1 * | 10/2010 | Chiu | ................ | H03K 19/17776 326/38 |
| 9,690,681 B1 * | 6/2017 | Ovadia | ................... | G06F 11/27 |
| 2003/0074153 A1 * | 4/2003 | Sugamori | ............. | G11C 29/56 702/122 |
| 2009/0077507 A1 * | 3/2009 | Hou | ..................... | G06F 17/5036 716/136 |
| 2011/0320160 A1 * | 12/2011 | Kosugi | ............ | G01R 31/31858 702/120 |
| 2014/0177314 A1 * | 6/2014 | Chu | ....................... | G11C 17/16 365/96 |

* cited by examiner

*Primary Examiner* — April Y Blair
*Assistant Examiner* — Dipakkumar B Gandhi
(74) *Attorney, Agent, or Firm* — Steven Roberts (57) ABSTRACT

Methods and apparatus are described for converting a pre-silicon Open Verification Methodology or Universal Verification Methodology (OVM/UVM) device under test (DUT) into a design implementable on a programmable integrated circuit (IC) and for converting the pre-silicon OVM/UVM stimulus from the driver and expected response from the scoreboard into timing aware stimulus-response vectors that can be applied through the tester onto the pads of the programmable IC that contains the implemented design. This approach can handle the clock and other input stimuli changing concurrently in the pre-silicon testbench, and the vectors generated therefrom will be in the proper form so as to work deterministically on the silicon on the tester.

20 Claims, 10 Drawing Sheets

| | CkA | CkB | DiA | EnA | DiB | EnB | DoA | DoB |
|---|---|---|---|---|---|---|---|---|
| Va1(Ia1,Sa1): | 0 | 0 | dia1 | ena0 | dib1 | enb0 | doa0(p) | dob0 |
| | 1 | 0 | dia1 | ena1 | dib1 | enb0 | doa1 | dob0 |
| Vb1(Ib1,Sb1): | 0 | 0 | dia2 | ena1 | dib2 | enb1 | doa1 | dob0(p) |
| | 0 | 1 | dia2 | ena1 | dib2 | enb1 | doa1 | dob1 |
| Va2(Ia2,Sa2): | 0 | 0 | dia3 | ena2 | dib3 | enb2 | doa1(p) | dob1 |
| | 1 | 0 | dia3 | ena2 | dib3 | enb2 | doa2 | dob1 |
| Vb2(Ib2,Sb2): | 0 | 0 | dia4 | ena3 | dib4 | enb3 | doa2 | dob1(p) |
| | 0 | 1 | dia4 | ena3 | dib4 | enb3 | doa2 | dob2 |
| Va3(Ia3,Sa3): | 0 | 0 | dia5 | ena4 | dib5 | enb4 | doa2(p) | dob2 |
| | 1 | 0 | dia5 | ena4 | dib5 | enb4 | doa3 | dob2 |
| Vb3(Ib3,Sb3): | 0 | 0 | dia6 | ena5 | dib6 | enb5 | doa3 | dob2(p) |
| | 0 | 1 | dia6 | ena5 | dib6 | enb5 | doa3 | dob3 |

Dat vectors: (p) for prev value

METHOD TO CONVERT OVM/UVM-BASED PRE-SILICON TESTS TO RUN POST-SILICON ON A TESTER

TECHNICAL FIELD

Examples of the present disclosure generally relate to electronic circuits and, more particularly, to testing programmable devices.

BACKGROUND

Integrated circuits (ICs) may be implemented to perform specified functions. One type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application specific integrated circuits (ASICs).

The increasingly high production costs of fabricating the silicon for the programmable ICs through every technology node are sunk costs, and there is elevated pressure to aggressively reduce the time to market to recover these costs through revenues. Therefore, it is imperative to conduct thorough feature-wise functional testing of the packaged programmable IC dies through the various process, voltage, and temperature (PVT) corners before shipment to customers. It is also important to attempt to minimize the costs by minimizing the test development time and the use of tester time per die, while maximizing the confidence level in the quality of the packaged programmable IC dies before customer shipment.

SUMMARY

Examples of the present disclosure generally relate to testing a programmable integrated circuit (IC).

One example of the present disclosure is a method of testing a programmable IC. The method generally includes running a simulation test on a device under test using a simulation testbench having input stimuli and an expected output associated with the simulation test, wherein the expected output is a function of the input stimuli and wherein the input stimuli comprise a clock signal; converting the simulation test into a data file, configuring the programmable IC; and testing the configured programmable IC based on the data file. The converting generally includes capturing the input stimuli at a plurality of input capture times according to the clock signal; capturing the expected output at a plurality of output capture times according to the clock signal; generating, for each particular edge of the clock signal, first and second vectors, wherein the first vector comprises the captured input stimuli associated with the current particular edge of the clock signal and the captured expected output associated with the prior particular edge of the clock signal and wherein the second vector comprises the captured input stimuli associated with the current particular edge of the clock signal and the captured expected output associated with the current particular edge of the clock signal; and writing the generated first and second vectors for each particular edge of the clock signal to the data file.

Another example of the present disclosure is a non-transitory computer-readable medium storing a plurality of testing instructions which, when executed by a processor, cause the processor to perform operations. The operations generally include running a simulation test on a device under test using a simulation testbench having input stimuli and an expected output associated with the simulation test, wherein the expected output is a function of the input stimuli and wherein the input stimuli comprise a clock signal; converting the simulation test into a data file, configuring the programmable IC; and testing the configured programmable IC based on the data file. The converting generally includes capturing the input stimuli at a plurality of input capture times according to the clock signal; capturing the expected output at a plurality of output capture times according to the clock signal; generating, for each particular edge of the clock signal, first and second vectors, wherein the first vector comprises the captured input stimuli associated with the current particular edge of the clock signal and the captured expected output associated with the prior particular edge of the clock signal and wherein the second vector comprises the captured input stimuli associated with the current particular edge of the clock signal and the captured expected output associated with the current particular edge of the clock signal; and writing the generated first and second vectors for each particular edge of the clock signal to the data file.

Yet another example of the present disclosure is a programmable IC test system. The test system generally includes a test board configured to receive a programmable IC for testing, a memory, and one or more processors coupled to the test board and to the memory. The one or more processors are generally configured to run a simulation test on a device under test using a simulation testbench having input stimuli and an expected output associated with the simulation test, wherein the expected output is a function of the input stimuli and wherein the input stimuli comprise a clock signal; to convert the simulation test into a data file; to configure the programmable IC via the test board; and to test the configured programmable IC based on the data file. The one or more processors are configured to convert the simulation test into a data file by capturing the input stimuli at a plurality of input capture times according to the clock signal; capturing the expected output at a plurality of output capture times according to the clock signal; generating, for each particular edge of the clock signal, first and second vectors, wherein the first vector comprises the captured input stimuli associated with the current particular edge of the clock signal and the captured expected output associated with the prior particular edge of the clock signal and wherein the second vector comprises the captured input stimuli associated with the current particular edge of the clock signal and the captured expected output associated with the current particular edge of the clock signal; and storing, in the memory, the data file with the generated first and second vectors for each particular edge of the clock signal written thereto.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide techniques and apparatus for converting a pre-silicon Open Verification Methodology or Universal Verification Methodology (OVM/UVM) device under test (DUT) into a design implementable on a programmable integrated circuit (IC) and for converting the pre-silicon OVM/UVM stimulus from the driver and expected response from the scoreboard into timing aware stimulus-response vectors that can be applied through the tester onto the pads of the programmable IC that contains the implemented design. This approach can handle the input and clock stimuli changing concurrently in the pre-silicon testbench, and the vectors generated therefrom will be in the proper form so as to work deterministically on the silicon on the tester.

Example Programmable Device Architecture

Figure 1:
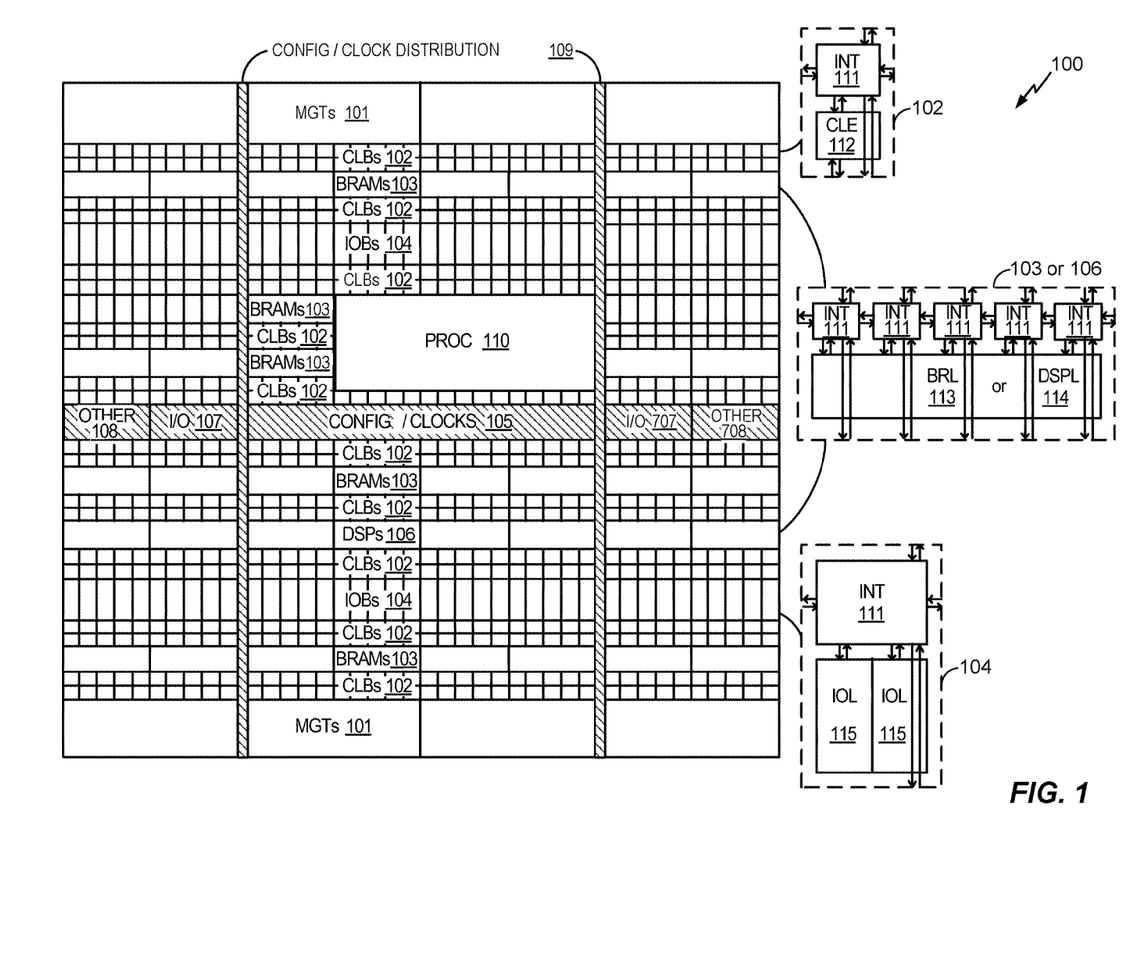
FIG. 1 is a block diagram illustrating an example architecture for a programmable device, in accordance with an example of the present disclosure.

FIG. 1 is a block diagram illustrating an example architecture 100 for a programmable device, in accordance with an example of the present disclosure. The architecture 100 may be implemented within a field programmable gate array (FPGA), for example. As shown, the architecture 100 includes several different types of programmable circuitry, e.g., logic blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Datfile Capturing and Programmable Ic Testing

Prior to fabricating programmable devices in silicon (i.e., pre-silicon), simulation testbenches that instantiate synthesizable designs are written to conduct pre-silicon timing independent functional verification. The testbenches may use any suitable hardware description language, such as Verilog or VHDL (Very High Speed Integrated Circuit (VHSIC) Hardware Description Language). The testbench designs instantiate the design components, such as device primitives (e.g., the lowest-level building blocks, which may be found in a UNISIM library offered by Xilinx, Inc. of San Jose, Calif.). Proper formatting of the designs ensures successful implementation by the synthesis tools. In some cases, the simulation testbenches may include targeted tests written by a verification engineer to take full advantage of the low-effort, constrained-random, and higher coverage tests from an Open Verification Methodology or a Universal Verification Methodology (OVM/UVM)-based pre-silicon verification environment.

Figure 2:
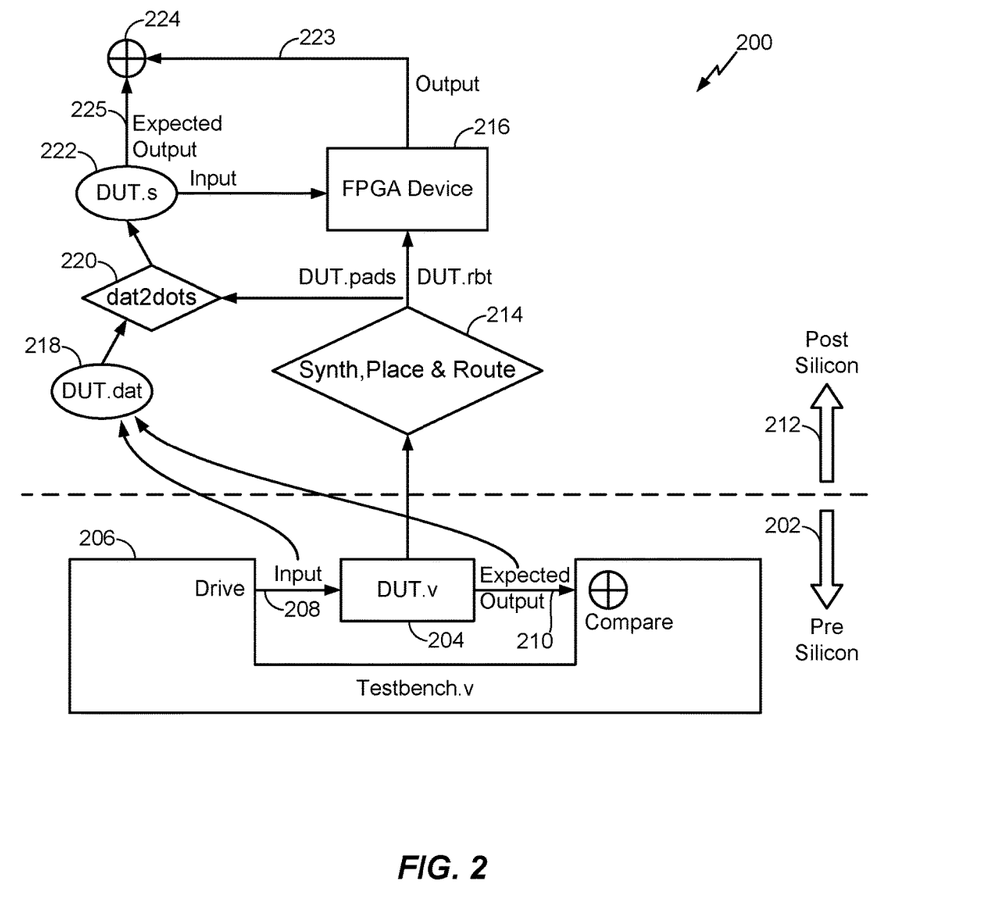
FIG. 2 illustrates an example programmable device verification methodology, in accordance with an example of the present disclosure.

FIG. 2 illustrates an example programmable device verification flow 200, in accordance with an example of the present disclosure. The verification flow 200 includes both a pre-silicon space 202 (with operations that need no programmable IC to run) and a post-silicon space 212 (with operations that involve the programmable IC). The pre-silicon space 202 involves running simulation tests on a device under test (DUT) 204 (e.g., DUT.v) using a simulation testbench 206 (e.g., Testbench.v). The testbench 206 generates input stimuli 208 that are applied to the DUT 204. The DUT 204 processes the input and generates one or more outputs 210, which are input back into the testbench 206. The outputs 210 may be displayed as text or as waveforms (allowing the designer to observe not only the values of the output signals, but also their relative timing).

For some examples, verification regressions may be run on the block level netlist, and the tests may be graded based on objective coverage criteria. Then, the highest value tests may be selected based on the coverage goals to be met for silicon verification.

After the DUT 204 has been verified in the testbench 206 to meet the designer's goals, the verification flow 200 may enter the post-silicon space 212. Based on the DUT configuration generated by the simulation logfiles, a synthesizable design may be created and run through the programmable IC implementation tools 214. The implementation tools 214 may perform synthesis, placing, and routing of the design to generate a configuration file (a raw bit file, e.g., DUT.rbt, with a configuration bitstream for the programmable IC) and a structural file (e.g., DUT.pads, with a listing of programmable IC pads). The configuration file is used to configure the actual programmable IC 216 (e.g., an FPGA device). For example, silicon verification may be performed on various programmable tiles of an FPGA, such as the BRAMs 103, DSP blocks 106, and the like of FIG. 1.

The input stimuli 208 and the outputs 210 are captured into a data file, also referred to as a "datfile" 218 (e.g., DUT.dat). The datfile 218 is processed with the structural file (e.g., DUT.pads) at 220 to create a stimulus file 222 (e.g., DUT.s). The stimulus file 222 is applied to the programmable IC 216 after configuration, and the actual outputs 223 of the programmable IC are compared at 224 to the expected outputs 225 from the stimulus file 222, which are ultimately based on the outputs 210 in the pre-silicon space 202, in an effort to verify that the operation of the programmable IC matches that of the DUT 204.

Figure 3:
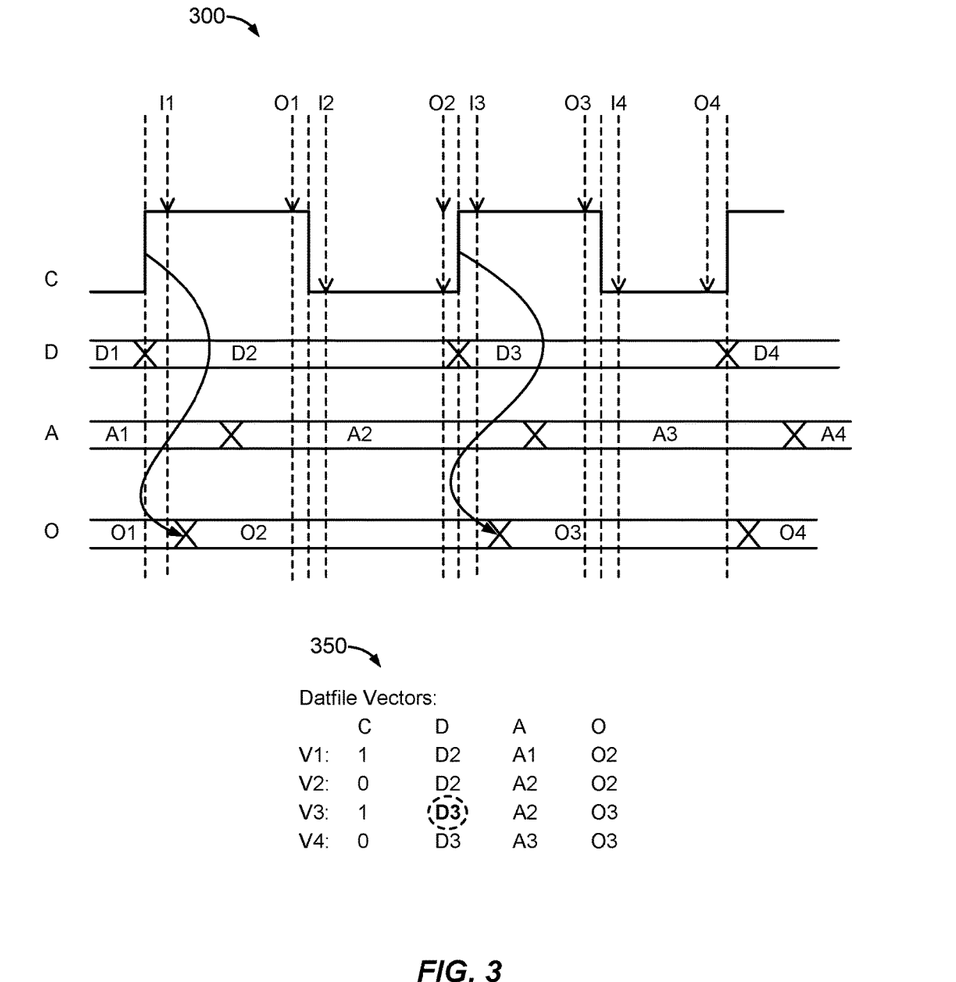
FIG. 3 illustrates an example datfile capture methodology.

FIG. 3 illustrates an example datfile capture methodology, in which the input stimuli 208 and outputs 210 are written to the datfile 218 as described above. This datfile capture methodology is illustrated with a waveform timing diagram 300 and a list of datfile vectors 350. Here, the DUT 204 is a static random-access memory (SRAM), for example, where "C" represents a clock signal, "D" represents input data, "A" represents an input address, and "O" represents the output, with time. C, D, and A are input stimuli 208 for the DUT 204, and O is the output 210 based on the input stimuli. I1, I2, I3, and I4 are the times at which the inputs driven are captured into the datfile 218, and O1, O2, O3, and O4 are the times at which the expected outputs are captured into the datfile. In this example, the input capture times are shortly after the rising edges and shortly after the falling edges of the clock signal, and the output capture times are shortly before the falling edges and shortly before the rising edges of the clock signal, respectively.

The example datfile capture methodology of FIG. 3 offers a relatively short list of datfile vectors 350 to write to the datfile 218. However, in an Open Verification Methodology or a Universal Verification Methodology (OVM/UVM), the clock and input data can change at the same time, but the simulator does not treat this as a timing violation and clocks in the updated input. Thus, using the datfile capture methodology of FIG. 3 with OVM/UVM can produce datfiles where the clock an input are changing at the same time and can show pass or fail depending on the routing delays of the clock and input. For example, note that D3 in the list of datfile vectors 350 represents both the clock signal and the input data changing at the same time, which may cause a race in the programmable IC 216 on the tester (in the post-silicon space 212), depending on how the clock and data nets are routed from the pads to a BRAM site input, for example. Due to this race, whenever any test failed on the programmable IC 216 on the tester, the debug effort was very high amid uncertainty whether the issue was with the testbench 206 or with (the silicon of) the programmable IC 216. Conventionally, therefore, tests were typically handwritten by the verification engineer and could not take advantage of the low-effort, constrained-random coverage-driven OVM/UVM. As a result, the post-silicon verification coverage was very low and based on human judgment in picking the tests to be run on the actual programmable IC 216.

Accordingly, what is needed are techniques and apparatus for an improved datfile capture methodology to verify a programmable IC using OVM or UVM.

Examples of the present disclosure provide methods and apparatus for converting a pre-silicon DUT into a design implementable on a programmable integrated circuit (IC) and for converting the pre-silicon stimulus from the driver and expected response from the scoreboard in an OVM/UVM testbench into timing aware stimulus-response vectors that can be applied through the tester onto the pads of the programmable IC that contains the implemented design. This approach can handle the clock and input data changing concurrently in the testbench, and the vectors generated therefrom will be in the proper form so as to work deterministically on the silicon on the tester.

Figure 4:
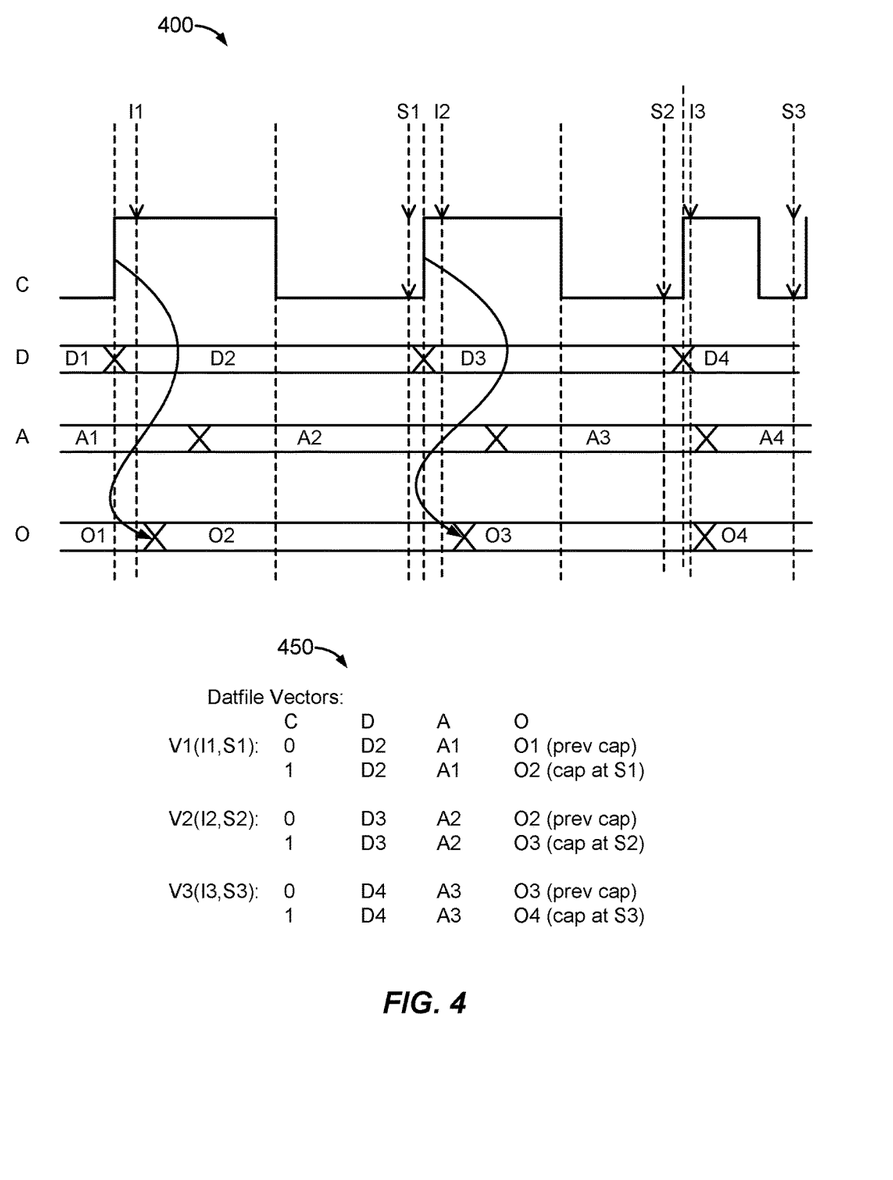
FIG. 4 illustrates an example datfile capture methodology for a common clock domain, in accordance with an example of the present disclosure.

FIG. 4 illustrates an example datfile capture methodology compatible with OVM/UVM for a common clock domain, in accordance with an example of the present disclosure. This datfile capture methodology is illustrated with an example waveform timing diagram 400 and an example list of datfile vectors 450. In the waveform timing diagram 400, the input capture times I1, I2, and I3 occur shortly after the rising edges of the current clock period (i.e., shortly after the current rising edge), and the output capture times S1, S2, and S3 occur shortly before the rising edges of the next clock period (i.e., shortly before the next rising edge), respectively. Thus, the vectors in the example list of datfile vectors 450 are generated at the rising edge of the clock signal. However, two vectors are generated for each input capture time, where the clock signal has a value of 0 for the first vector and a value of 1 for the second vector. The previous output capture value is recalled for the first vector, whereas the current output capture value associated with the output for the current clock period (i.e., for the current rising edge of the clock signal) is used for the second vector. In this manner, the input changes are effectively pushed to the falling edges of the clock signal, and the race described above is avoided. The previous output capture value is recalled in an effort to ensure that the output O does not change in the datfile 218 without being triggered by the clock signal.

For example, the first pair of vectors V1(I1, S1) in the example list of datfile vectors 450 have the same input data value of D2 and the same input address value of A1 according to the input capture time I1 in the example waveform timing diagram 400. The first vector of V1(I1, S1) has a clock signal value of 0 and a previous output capture value of O1, whereas the second vector of V1(I1, S1) has a clock signal value of 1 and a current output capture value of O2 according to the current output capture time S1. Likewise, the second pair of vectors V2(I2, S2) in the example list of datfile vectors 450 have the same input data value of D3 and the same input address value of A2 according to the input capture time I2 in the example waveform timing diagram 400. The first vector of V2(I2, S2) has a clock signal value of 0 and a previous output capture value of O2 according to the prior output capture time S1, whereas the second vector of V2(I2, S2) has a clock signal value of 1 and a current output capture value of O3 according to the current output capture time S2.

For some examples, the input capture times and output capture times may be based on the falling edges of the clock signal, rather than on the rising edges as illustrated in FIG. 4. In this case, input data may be captured just after the falling edges of the current clock period (i.e., just after the current falling edge), and the output data may be captured just before the falling edges of the next clock period (i.e., just before the next falling edge).

With this datfile capture methodology, race conditions due to concurrent clock and input data changes in the OVM/UVM testbench are properly handled. Such changes then run properly on the silicon tester and give deterministic results, thereby decreasing the debug effort if a test for the programmable IC 216 fails on the tester.

Figure 5:
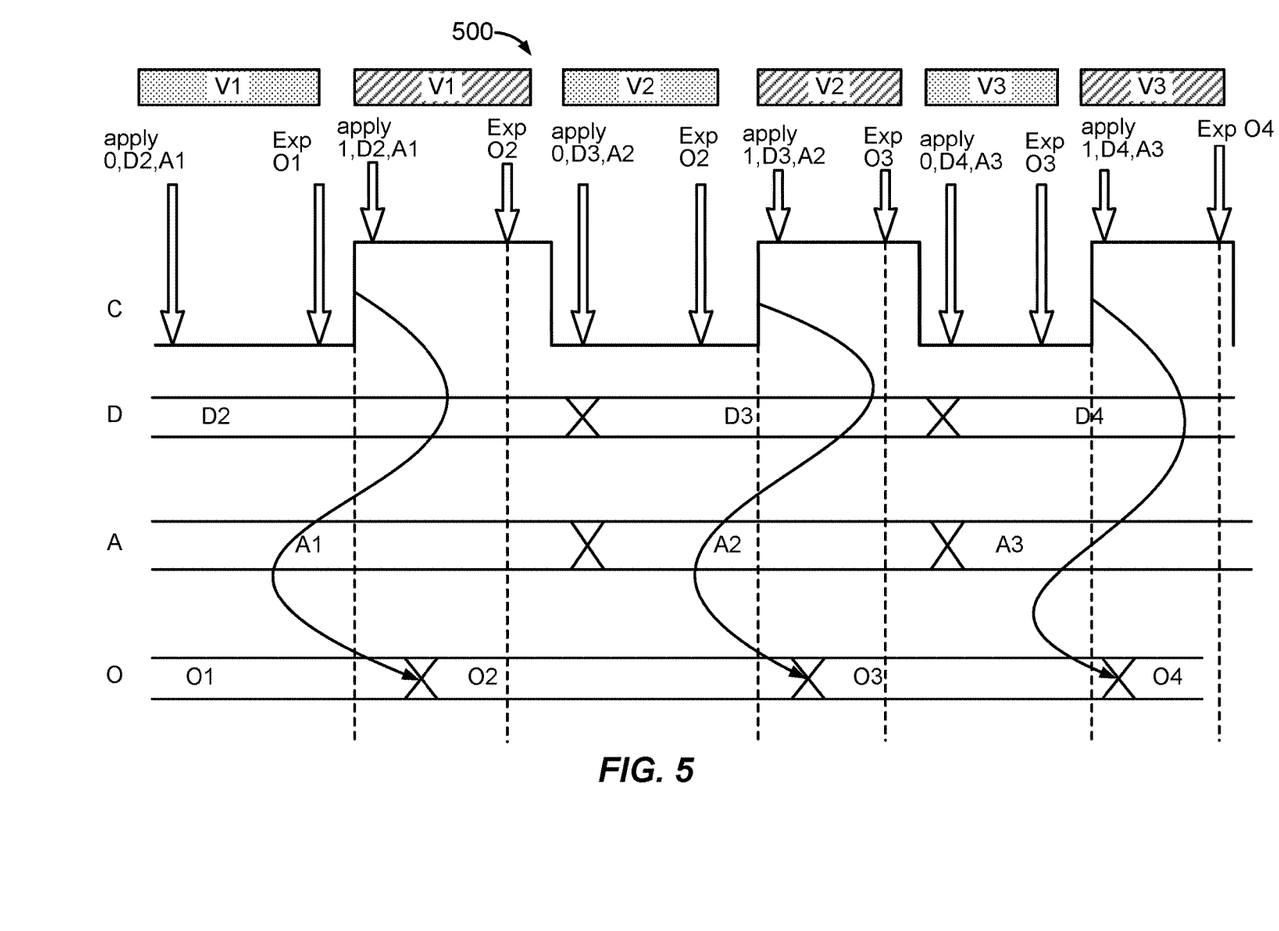
FIG. 5 illustrates the datfile vectors of FIG. 4 as applied on a tester, in accordance with an example of the present disclosure.

FIG. 5 illustrates the example list of datfile vectors 450 as applied on a tester in the example waveform timing diagram 500, in accordance with an example of the present disclosure. The waveform timing diagram 500 may be based on the stimulus file 222. The first vector of each vector pair is applied for the low phase of the clock signal (i.e., when the clock signal value is 0), and the second vector of the pair is applied for the high phase of the clock signal (i.e., when clock signal value is 1).

With this datfile capture methodology, the input changes are effectively pushed to the falling edges of the clock signal as shown. For example, in the waveform timing diagram 400 of FIG. 4, the input data value in the testbench 206 changes from D2 to D3 on the rising edge of the clock signal. However, due to the datfile capture methodology with the vector pairs described above, the input data value in the stimulus file 222 (as applied to the programmable IC 216 on the tester and reflected in the waveform timing diagram 500 of FIG. 5) changes from D2 to D3 at least a half cycle later (e.g., shortly after the falling edge of the clock signal). In this manner, the input data is guaranteed to meet the setup-and-hold time of the programmable IC 216 on the tester, thereby making the verification results more deterministic.

Figure 6:
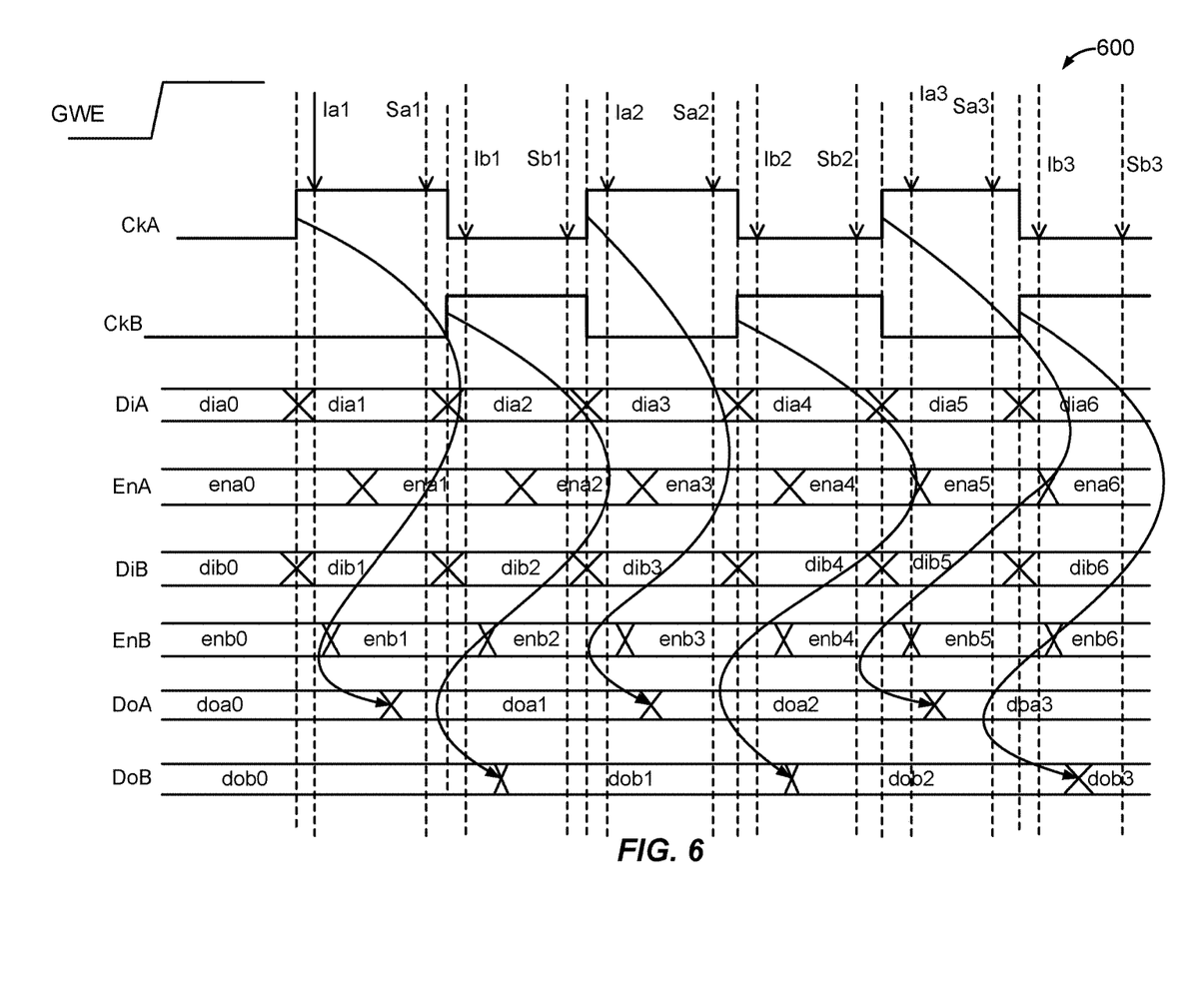
FIGS. 6 and 6A illustrate an example datfile capture methodology for an independent clock domain, in accordance with an example of the present disclosure.
Figure 6A:
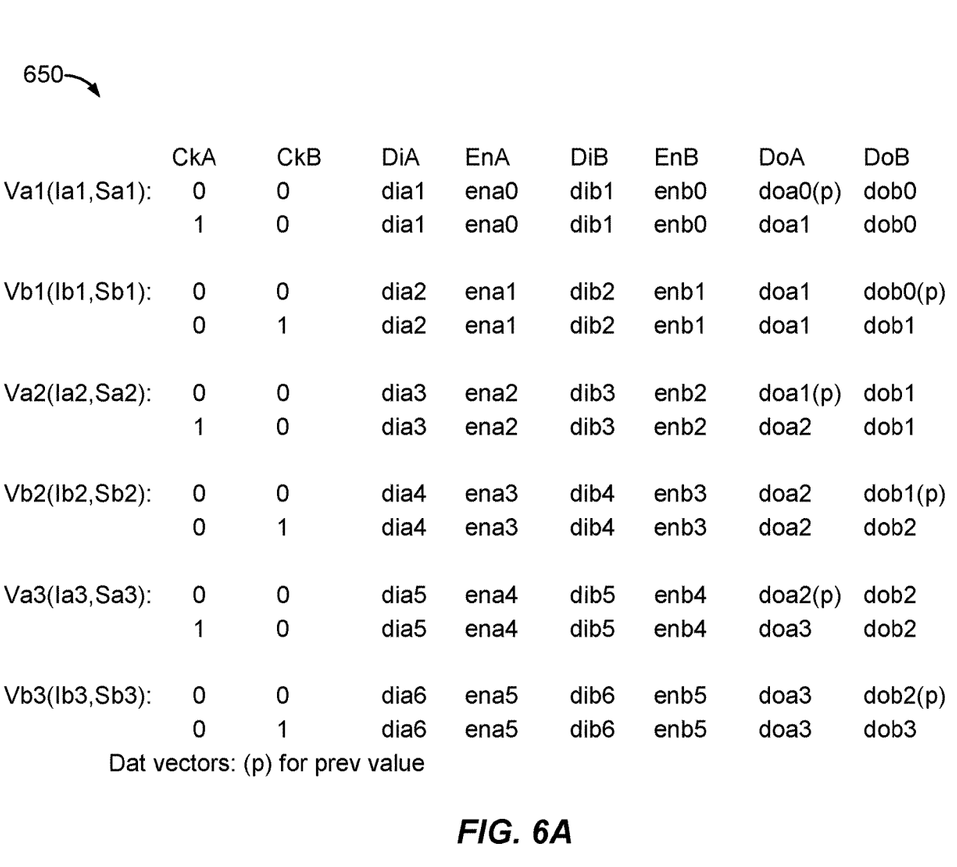

FIGS. 6 and 6A illustrate the example datfile capture methodology of FIG. 4 for an independent clock domain, in accordance with an example of the present disclosure. This datfile capture methodology for an independent clock domain is illustrated with an example waveform timing diagram 600 in FIG. 6 and an example list of datfile vectors 650 in FIG. 6A. Unlike a common clock domain where only a single clock signal is used for the DUT 204, a DUT with an independent clock domain has multiple clock signals. For example, the example waveform timing diagram 600 illustrates a first clock signal (CkA) and a second clock signal (CkB), where CkB is the inverse of CkA. In the waveform timing diagram 600, the input capture times Ia1, Ia2, and Ia3 occur shortly after the rising edges of the current CkA period (i.e., shortly after the current rising edges), and the output capture times Sa1, Sa2, and Sa3 occur shortly before the falling edges of the current CkA period (i.e., shortly before the next edges of CkA). The input capture times Ib1, Ib2, and Ib3 occur shortly after the rising edges of the current CkB period (i.e., shortly after the current rising edges), and the output capture times Sb1, Sb2, and Sb3 occur shortly before the falling edges of the current CkB period. Thus, the vectors in the example list of datfile vectors 650 are generated at the rising edges of the CkA and CkB signals. As described above, two vectors are generated for each input capture time, where the appropriate clock signal (CkA or CkB) has a value of 0 for the first vector and a value of 1 for the second vector and the other clock signal has a value of 0 for both the first and second vectors. The previous output capture value associated with the appropriate clock signal (CkA or CkB) is recalled for the first vector, whereas the current output capture value associated with the output (DoA or DoB) for the current clock period (i.e., for the current rising edge of the appropriate clock signal) is used for the second vector.

For example, the first pair of vectors Va1 (Ia1, Sa1) in the example list of datfile vectors 650 have the same input data value of dia1 and the same enable value of ena0 according to the input capture time Ia1 in the example waveform timing diagram 600. The first vector of Val (Ia1, Sa1) has a CkA value of 0 and a previous output capture value of doa0, whereas the second vector of Val (Ia1, Sa1) has a CkA value of 1 and a current output capture value of doa1 according to the current output capture time Sa1. The first pair of vectors Val (Ia1, Sa1) also have the same CkB value of 0, the same input data value of dib1, the same enable value of enb0, and the same output capture value of dob0. Likewise, the second pair of vectors Vb1(Ib1, Sb1) in the example list of datfile vectors 650 have the same input data value of dib2 and the same enable value of enb1 according to the input capture time Ib1 in the example waveform timing diagram 600. The first vector of Vb1(Ib1, Sb1) has a CkB value of 0 and a previous output capture value of dob0, whereas the second vector of Vb1(Ib1, Sb1) has a CkB value of 1 and a current output capture value of dob1 according to the current output capture time Sb1. The second pair of vectors Vb1(Ib1, Sb1) also have the same CkA value of 0, the same input data value of dia2, the same enable value of ena1, and the same output capture value of doa1.

Figure 7:
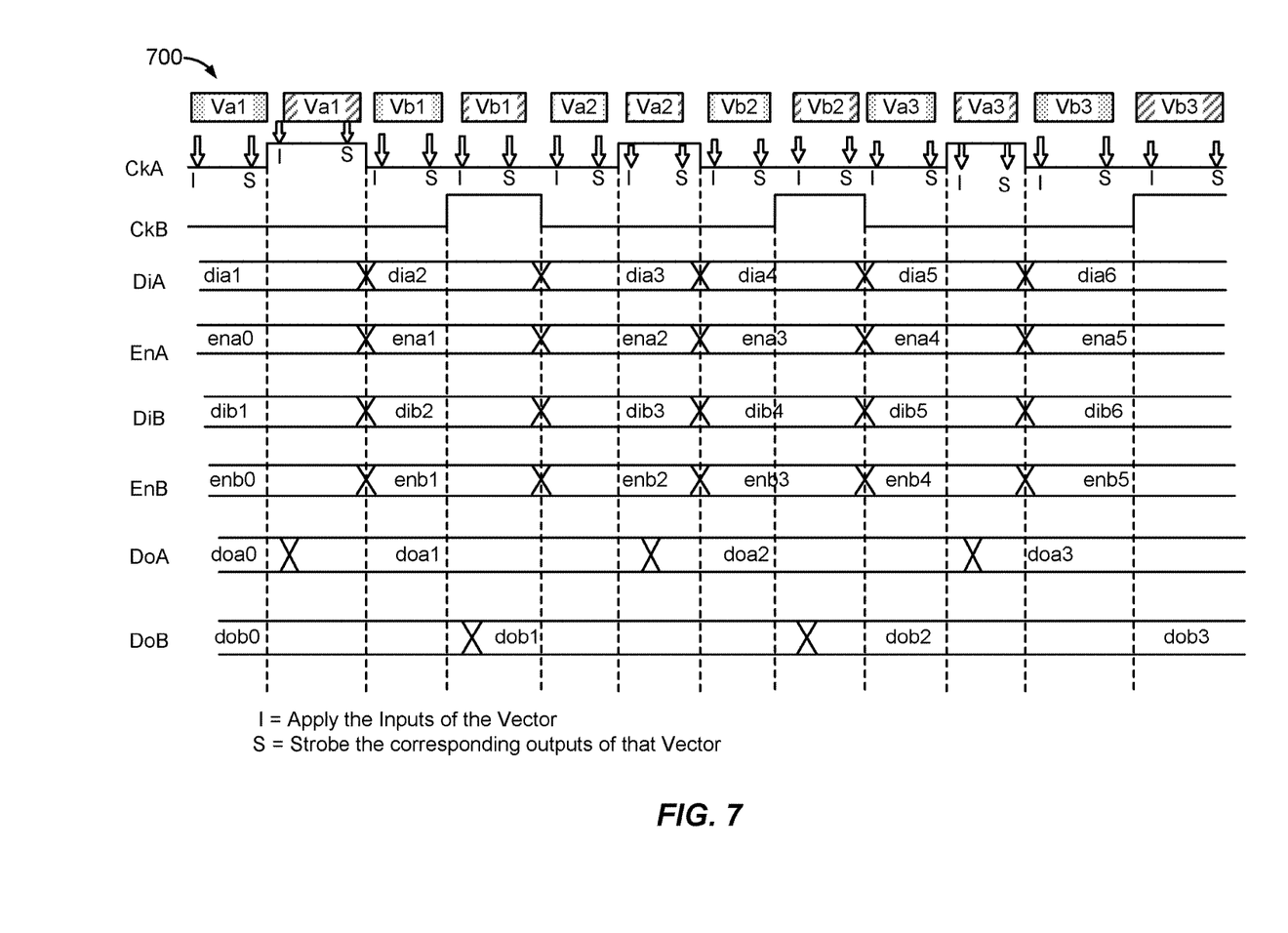
FIG. 7 illustrates the datfile vectors of FIG. 6A as applied on a tester, in accordance with an example of the present disclosure.

FIG. 7 illustrates the example list of datfile vectors 650 as applied on a tester in the example waveform timing diagram 700, in accordance with an example of the present disclosure. The waveform timing diagram 700 may be based on the stimulus file 222. The first vector of each vector pair is applied for the low phase of the appropriate clock signal (i.e., when the appropriate clock signal value is 0), and the second vector of the pair is applied for the high phase of the appropriate clock signal (i.e., when the appropriate clock signal value is 1). In other words, the first vector of each vector pair labeled Va is applied for the low phase of CkA, and the second vector of each vector pair labeled Va is applied for the high phase of CkA. Likewise, the first vector of each vector pair labeled Vb is applied for the low phase of CkB, and the second vector of each vector pair labeled Vb is applied for the high phase of CkB.

Example Operations for Testing a Programmable IC

Figure 8:
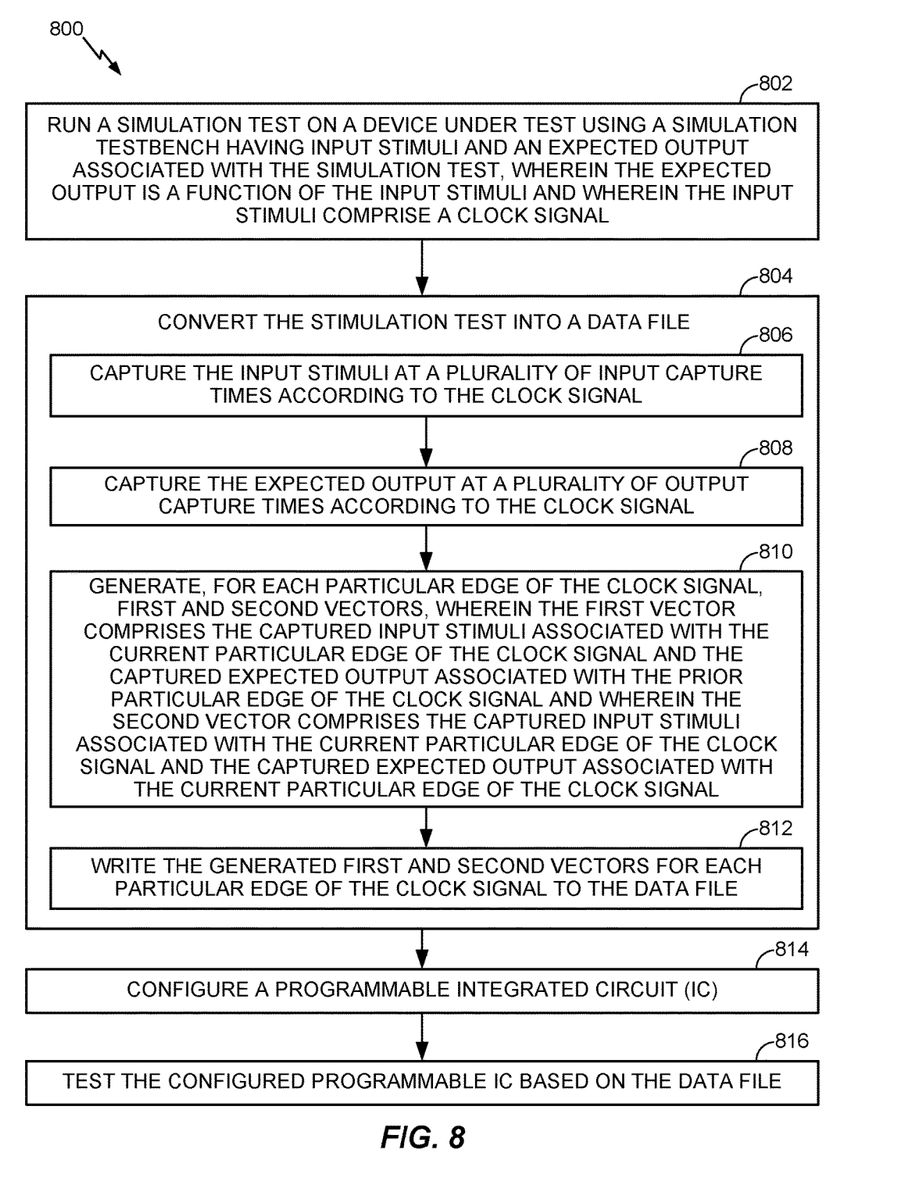
FIG. 8 is a flow diagram of example operations for testing a programmable device, in accordance with an example of the present disclosure.
Figure 9:
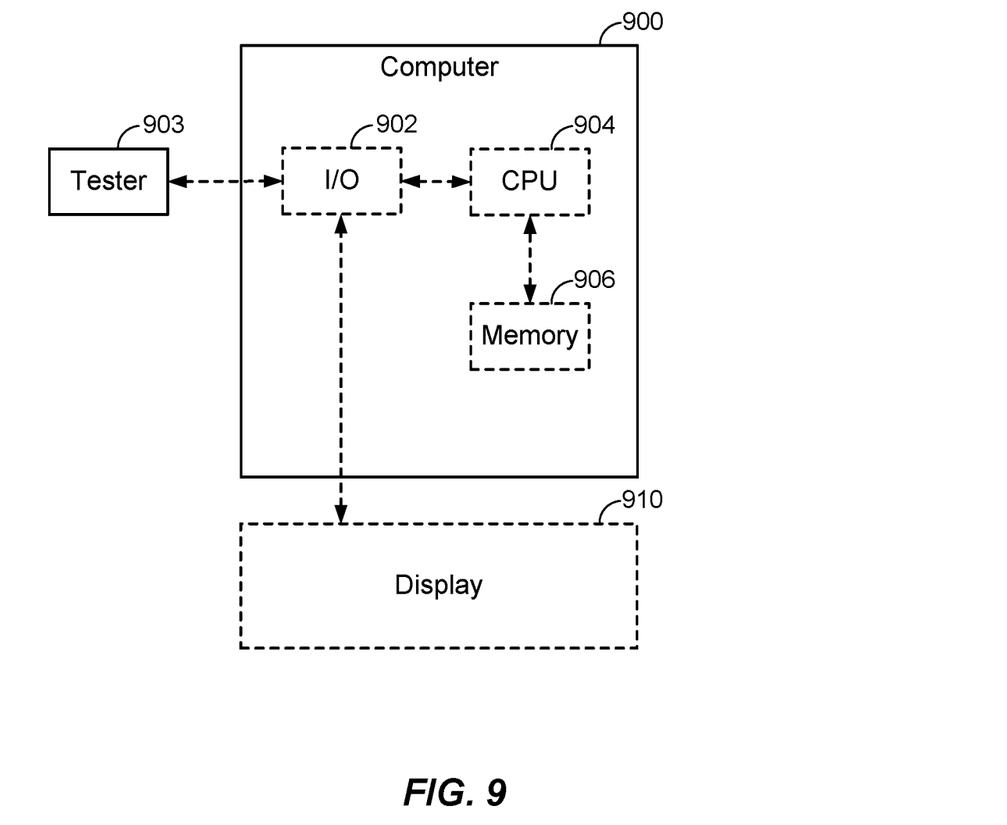
FIG. 9 is a block diagram of a general-purpose computer that may be used as a processing system for testing a programmable device, in accordance with an example of the present disclosure.

FIG. 8 is a flow diagram of example operations 800 for testing a programmable IC, in accordance with an example of the present disclosure. The operations 800 may be performed, for example, by an apparatus having a processing system, such as a general-purpose computer 900 as illustrated in FIG. 9 and described below. The apparatus may be connected with a test board for programming and testing the programmable IC.

The operations 800 may begin, at block 802, with the apparatus running a simulation test on a device under test (DUT) using a simulation testbench (e.g., testbench 206) having input stimuli (e.g., input stimuli 208) and an expected output (e.g., output 210) associated with the simulation test. The expected output is a function of the input stimuli, and the input stimuli include a clock signal (e.g., clock signal "C"). For some examples, the testbench includes an Open Verification Methodology or a Universal Verification Methodology (OVM/UVM) testbench.

At block 804, the apparatus may convert the simulation test into a data file (e.g., a datfile 218). This conversion may involve the apparatus capturing the input stimuli at a plurality of input capture times according to the clock signal at block 806 and capturing the expected output at a plurality of output capture times according to the clock signal at block 808. For some examples, the plurality of input capture times occur just after the current particular edge of the clock signal, and the plurality of output capture times occur just before the next particular edge of the clock signal (as in FIG. 4, for example, where I1, I2, and I3 occur just after the rising edge of C and S1, S2, and S3 occur just before the next rising edge of C). For other examples, the plurality of input capture times occur just after the current particular edge of the clock signal, and the plurality of output capture times occur just before the next edge of the clock signal (as in FIG. 6, for example, where Ia1, Ia2, and Ia3 occur just after the rising edge of CkA and Sa1, Sa2, and Sa3 occur just before the falling edge of CkA).

The conversion at block 804 may further include the apparatus generating first and second vectors for each particular edge of the clock signal at block 810. For some examples, the particular edge of the clock signal is a rising edge of the clock signal, while in other examples, the particular edge of the clock signal is a falling edge of the clock signal. The first vector may include the captured input stimuli associated with the current particular edge of the clock signal and the captured expected output associated with the prior particular edge of the clock signal. The second vector may include the captured input stimuli associated with the current particular edge of the clock signal and the captured expected output associated with the current particular edge of the clock signal. In the case of the particular edge of the clock signal being a rising edge, the first vector may include a clock signal value of 0, and the second vector may include a clock signal value of 1. At block 812, the apparatus may write the generated first and second vectors for each particular edge of the clock signal to the data file.

At block 814, the apparatus may configure the programmable IC. At block 816, the apparatus may test the configured programmable IC based on the data file.

According to some examples, the operations 800 further involve the apparatus converting the device under test into an implementable design for the programmable IC and creating a configuration file (e.g., a *.rbt file) and a structural file (e.g., a *.pads file) based on the implementable design for the programmable IC. In this case, the apparatus may configure the programmable IC at block 814 using the configuration file. For some examples, the operations 800 further entail the apparatus processing the structural file and the data file to create a stimulus file (e.g., a *.s file or stimulus file 222) for the programmable IC. In this case, the apparatus may test the configured programmable IC by applying inputs to the programmable IC based on the stimulus file and determining whether outputs observed on pads of the programmable IC match expected values in the stimulus file.

According to some examples, the simulation testbench has other input stimuli and another expected output associated with the simulation test, where the other expected output is a function of the other input stimuli and the other input stimuli comprise another clock signal (as in FIG. 6, for example). In this case, converting the simulation test into a data file at block 804 may further involve capturing the other input stimuli at another plurality of input capture times according to the other clock signal; capturing the other expected output at another plurality of output capture times according to the other clock signal; generating, for each particular edge of the other clock signal, third and fourth vectors; and writing the generated third and fourth vectors for each particular edge of the other clock signal to the data file. The third vector may include the captured other input stimuli associated with the current particular edge of the other clock signal and the captured other expected output associated with the prior particular edge of the other clock signal. The fourth vector may include the captured other input stimuli associated with the current particular edge of the other clock signal and the captured other expected output associated with the current particular edge of the other clock signal.

According to some examples, the apparatus for testing the programmable IC may be implemented with a general-purpose computer 900, as illustrated in FIG. 9. The computer 900 includes a central processing unit (CPU) 904, one or more input/output (I/O) ports 902 connected with the CPU 904, and a memory 906 connected with the CPU 904. Although shown as being internal to the computer 900, the memory 906 may also be external to the computer 900 or both internal and external thereto. For some examples, the simulation testbench 206 may run on the CPU 904. The computer 900 may be connected with a tester 903 (e.g., a test board) via the I/O ports 902 for performing testing of the programmable IC 216 in the post-silicon space 212. For some examples, the computer 900 may also be connected with a display 910 (e.g., an LED display, plasma display, LCD display, cathode ray tube (CRT), and the like) via the I/O ports 902.

CONCLUSION

Examples of the present disclosure involve capturing a datfile by generating two vectors for each particular edge of a testbench clock signal and remembering the previous capture value of the output to avoid a race condition and make sure the output does not change in the datfile without getting triggered by the clock signal. This approach can handle the clock signal and other input stimuli changing simultaneously in the pre-silicon OVM/UVM testbench, and the vectors in the datfile will be generated so as to work deterministically on the silicon on the tester.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method of testing a programmable integrated circuit (IC), comprising:
running a simulation test on a device under test using a simulation testbench having input stimuli and an expected output associated with the simulation test, wherein the expected output is a function of the input stimuli and wherein the input stimuli comprise a clock signal;
converting the simulation test into a data file, the converting comprising:
capturing the input stimuli at a plurality of input capture times according to the clock signal;
capturing the expected output at a plurality of output capture times according to the clock signal;
generating, for each particular edge of the clock signal, first and second vectors, wherein:
the first vector comprises the captured input stimuli associated with the current particular edge of the clock signal and the captured expected output associated with the prior particular edge of the clock signal; and
the second vector comprises the captured input stimuli associated with the current particular edge of the clock signal and the captured expected output associated with the current particular edge of the clock signal; and
writing the generated first and second vectors for each particular edge of the clock signal to the data file;
configuring the programmable IC; and
testing the configured programmable IC based on the data file.

2. The method of claim 1, wherein the particular edge of the clock signal comprises a rising edge of the clock signal, wherein the first vector comprises a clock signal value of 0, and wherein the second vector comprises a clock signal value of 1.

3. The method of claim 1, wherein the plurality of input capture times occur just after the current particular edge of the clock signal and wherein the plurality of output capture times occur just before the next particular edge of the clock signal.

4. The method of claim 1, wherein the plurality of input capture times occur just after the current particular edge of the clock signal and wherein the plurality of output capture times occur just before the next edge of the clock signal.

5. The method of claim 1, wherein:
the simulation testbench has other input stimuli and another expected output associated with the simulation test;
the other expected output is a function of the other input stimuli;
the other input stimuli comprise another clock signal; and
converting the simulation test into the data file further comprises:
capturing the other input stimuli at another plurality of input capture times according to the other clock signal;
capturing the other expected output at another plurality of output capture times according to the other clock signal;
generating, for each particular edge of the other clock signal, third and fourth vectors, wherein:
the third vector comprises the captured other input stimuli associated with the current particular edge of the other clock signal and the captured other expected output associated with the prior particular edge of the other clock signal; and
the fourth vector comprises the captured other input stimuli associated with the current particular edge of the other clock signal and the captured other expected output associated with the current particular edge of the other clock signal; and
writing the generated third and fourth vectors for each particular edge of the other clock signal to the data file.

6. The method of claim 1, wherein the simulation testbench comprises an Open Verification Methodology or a Universal Verification Methodology (OVM/UVM) testbench.

7. The method of claim 1, further comprising:
converting the device under test into an implementable design for the programmable IC; and
creating a configuration file and a structural file based on the implementable design for the programmable IC, wherein the configuring comprises configuring the programmable IC using the configuration file.

8. The method of claim 7, further comprising processing the structural file and the data file to create a stimulus file for the programmable IC, wherein testing the configured programmable IC comprises:
- applying inputs to the programmable IC based on the stimulus file; and
- determining whether outputs observed on pads of the programmable IC match expected values in the stimulus file.

9. A non-transitory computer-readable medium storing a plurality of testing instructions which, when executed by a processor, cause the processor to perform operations, the operations comprising:
- running a simulation test on a device under test using a simulation testbench having input stimuli and an expected output associated with the simulation test, wherein the expected output is a function of the input stimuli and wherein the input stimuli comprise a clock signal;
- converting the simulation test into a data file, the converting comprising:
  - capturing the input stimuli at a plurality of input capture times according to the clock signal;
  - capturing the expected output at a plurality of output capture times according to the clock signal;
  - generating, for each particular edge of the clock signal, first and second vectors, wherein:
    - the first vector comprises the captured input stimuli associated with the current particular edge of the clock signal and the captured expected output associated with the prior particular edge of the clock signal; and
    - the second vector comprises the captured input stimuli associated with the current particular edge of the clock signal and the captured expected output associated with the current particular edge of the clock signal; and
  - writing the generated first and second vectors for each particular edge of the clock signal to the data file;
- configuring a programmable integrated circuit (IC); and
- testing the configured programmable IC based on the data file.

10. The computer-readable medium of claim 9, wherein the particular edge of the clock signal comprises a falling edge of the clock signal.

11. The computer-readable medium of claim 9, wherein the plurality of input capture times occur just after the current particular edge of the clock signal and wherein the plurality of output capture times occur just before the next particular edge of the clock signal.

12. The computer-readable medium of claim 9, wherein the simulation testbench comprises an Open Verification Methodology or a Universal Verification Methodology (OVM/UVM) testbench.

13. The computer-readable medium of claim 9, wherein the operations further comprise:
- converting the device under test into an implementable design for the programmable IC; and
- creating a configuration file and a structural file based on the implementable design for the programmable IC, wherein the configuring comprises configuring the programmable IC using the configuration file.

14. The computer-readable medium of claim 13, wherein the operations further comprise processing the structural file and the data file to create a stimulus file for the programmable IC, wherein testing the configured programmable IC comprises:
- applying inputs to the programmable IC based on the stimulus file; and
- determining whether outputs observed on pads of the programmable IC match expected values in the stimulus file.

15. A programmable integrated circuit (IC) test system comprising:
- a test board configured to receive a programmable IC for testing;
- a memory; and
- one or more processors coupled to the test board and to the memory, the one or more processors being configured to:
  - run a simulation test on a device under test using a simulation testbench having input stimuli and an expected output associated with the simulation test, wherein the expected output is a function of the input stimuli and wherein the input stimuli comprise a clock signal;
  - convert the simulation test into a data file by:
    - capturing the input stimuli at a plurality of input capture times according to the clock signal;
    - capturing the expected output at a plurality of output capture times according to the clock signal;
    - generating, for each particular edge of the clock signal, first and second vectors, wherein:
      - the first vector comprises the captured input stimuli associated with the current particular edge of the clock signal and the captured expected output associated with the prior particular edge of the clock signal; and
      - the second vector comprises the captured input stimuli associated with the current particular edge of the clock signal and the captured expected output associated with the current particular edge of the clock signal;
    - storing, in the memory, the data file with the generated first and second vectors for each particular edge of the clock signal written thereto;
  - configure the programmable IC via the test board; and
  - test the configured programmable IC based on the data file.

16. The test system of claim 15, wherein the particular edge of the clock signal comprises a rising edge of the clock signal.

17. The test system of claim 15, wherein the plurality of input capture times occur just after the current particular edge of the clock signal and wherein the plurality of output capture times occur just before the next edge of the clock signal.

18. The test system of claim 15, wherein the simulation testbench comprises an Open Verification Methodology or a Universal Verification Methodology (OVM/UVM) testbench.

19. The test system of claim 15, wherein the one or more processors are further configured to:
- convert the device under test into an implementable design for the programmable IC;
- create a configuration file and a structural file based on the implementable design for the programmable IC; and
- store the configuration file and the structural file in the memory, wherein the one or more processors are adapted to configure the programmable IC using the configuration file.

20. The test system of claim 19, wherein the one or more processors are further configured to process the structural file and the data file to create a stimulus file for the programmable IC, wherein the one or more processors are configured to test the configured programmable IC by:
  applying inputs to the programmable IC based on the stimulus file via the test board; and
  determining whether outputs observed on pads of the programmable IC match expected values in the stimulus file.

* * * * *